(12) United States Patent
Fath et al.

(10) Patent No.: US 8,198,893 B2
(45) Date of Patent: Jun. 12, 2012

(54) METHOD TO DESIGN A GRADIENT COIL, METHOD TO MANUFACTURE A GRADIENT COIL, GRADIENT COIL, MAGNETIC RESONANCE APPARATUS AND COMBINED PET-MR SYSTEM

(75) Inventors: Sascha Fath, Erlangen (DE); Ralf Ladebeck, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 320 days.

(21) Appl. No.: 12/566,837

(22) Filed: Sep. 25, 2009

(65) Prior Publication Data
US 2010/0134108 A1   Jun. 3, 2010

(30) Foreign Application Priority Data
Sep. 25, 2008   (DE) .......................... 10 2008 048 873

(51) Int. Cl.
*G01V 3/00*   (2006.01)
(52) U.S. Cl. ........................................ 324/309; 324/307
(58) Field of Classification Search .......... 324/300–322; 600/407–445; 250/363.03–364.04
See application file for complete search history.

(56) References Cited

U.S. PATENT DOCUMENTS

| | | | | |
|---|---|---|---|---|
| 5,914,599 A * | 6/1999 | Sharp | ............................. | 324/318 |
| 6,060,882 A * | 5/2000 | Doty | ............................. | 324/318 |
| 6,208,140 B1 * | 3/2001 | Gebhardt et al. | ............. | 324/309 |
| 6,342,787 B1 * | 1/2002 | Petropoulos et al. | ......... | 324/320 |
| 7,276,906 B2 * | 10/2007 | Shvartsman et al. | ......... | 324/318 |
| 2004/0021465 A1 * | 2/2004 | Hollis | ............................. | 324/318 |
| 2005/0148862 A1 | 7/2005 | Sellers | | |
| 2007/0102641 A1 | 5/2007 | Schmand et al. | | |
| 2007/0262776 A1 * | 11/2007 | Petropoulos et al. | ......... | 324/318 |
| 2008/0272784 A1 | 11/2008 | Harvey et al. | | |
| 2011/0012599 A1 * | 1/2011 | Gao et al. | ...................... | 324/318 |

* cited by examiner

*Primary Examiner* — Brij Shrivastav
(74) *Attorney, Agent, or Firm* — Schiff Hardin LLP

(57) ABSTRACT

In a method for designing a gradient coil composed of multiple sub-coils, parameters representing the structure of the gradient coil are varied, and the variation that produces an optimized electrical field generated by the gradient coil is determined. The final design of the gradient coil embodies those parameters that produced the optimal electrical field. In a method for manufacturing a gradient coil, the gradient coil is manufactured according to the final design. A gradient coil manufactured according to the invention has a gradient conductor configuration that optimizes the electrical field generated by the gradient coil. A magnetic resonance apparatus, and a combined positron emission tomography/magnetic resonance apparatus, embodies such a gradient coil.

25 Claims, 3 Drawing Sheets

METHOD TO DESIGN A GRADIENT COIL, METHOD TO MANUFACTURE A GRADIENT COIL, GRADIENT COIL, MAGNETIC RESONANCE APPARATUS AND COMBINED PET-MR SYSTEM

BACKGROUND OF THE INVENTION

1. Field of the Invention

The present invention concerns a method to design a gradient coil, a method to manufacture a gradient coil, a gradient coil, a magnetic resonance apparatus and a combined PET-MR system.

2. Description of the Prior Art

Known medical imaging techniques include nuclear medicine techniques that primarily image functional processes in an examination subject, as well as techniques that primarily image anatomy (for example magnetic resonance techniques and computed tomography techniques).

The PET technique (PET: positron emission tomography) is among the nuclear medicine imaging techniques. PET generates images of living organisms in that it shows the distribution of a previously administered, weakly radioactive marked substance (radiopharmaceutical) in the organism that has accumulated in the organism such that biochemical and physiological processes can be imaged.

Radionuclides that emit positrons upon decay are hereby suitable as radiopharmaceuticals. The positrons interact with an electron at a short distance (approximately 2-3 mm) and this leads to what is known as annihilation. Both particles (positron and electron) are thereby annihilated, and two high-energy photons (gamma radiation) arise with 511 keV each. They depart at an angle of approximately 180° from one another. The line that is thereby formed is also designated as a "line of response" (LOR). The two photons (annihilation radiation) are measured, for example at a detector ring where they simultaneously impact at two points. Confirmation of the positron emission and an estimation of the location of the annihilation are possible due to the coincidence of the two measurement results.

The magnetic resonance technique (in the following the abbreviation MR stands for magnetic resonance) is a known technique with which images of the inside of an examination subject can be generated. Expressed simply, for this the examination subject is positioned in a comparably strong, static, homogeneous basic magnetic field (field strengths from 0.2 Tesla to 7 Tesla and more) so that its nuclear spins orient along the basic magnetic field. To trigger nuclear magnetic resonances, radio-frequency excitation pulses are radiated into the examination subject, the triggered nuclear magnetic resonances are measured and MR images are reconstructed based on these. For spatial coding of the measurement data, rapidly switched gradient fields are superimposed on the basic magnetic field in three spatial directions. The acquired measurement data are digitized and stored in a k-space matrix as complex numerical values. By means of a multidimensional Fourier transformation, an associated MR image can be reconstructed from the k-space matrix populated with values. This technique allows an excellent depiction (in particular of soft tissues) with selectable contrasts.

In order to be able to utilize the advantages of both techniques synergistically, efforts have been made to combine MR and PET systems. One example of a combined PET/MR system with a PET detector suitable for MR is described in United States Patent Application Publication No. US 2007/0102641.

Furthermore, there exists a need for improved components for combined PET-MR apparatuses as well as for magnetic resonance apparatuses.

SUMMARY OF THE INVENTION

It is an object of the present invention to provide a method to design an a method to manufacture an improved gradient coil, as well as an improved gradient coil with which malfunctions in the apparatuses in which the gradient coil is used are avoided.

Furthermore, it is an object of the invention to specify a magnetic resonance a with improved measurement properties as well as a combined PET-MR system with improved measurement properties.

The invention is based on the insight that previously unused free parameters for further optimizations can be used in the development of gradient coils in which previously only the quality of the achieved magnetic field in the measurement volume within the gradient coil and possibly a good suppression of the magnetic field in the external region of the gradient coil have been taken into account.

In a method according to the invention for the design of a gradient coil that has multiple sub-coils, the following Steps are implemented:

variation of parameters of the structure of the gradient coil, determination of the electrical field generated by the variations of the structure of the gradient coil, selection of the parameters of the variation of the structure with an optimal electrical field.

The optimization can ensue according to different points of view. For example, an electrical field that is as homogeneous as possible overall can be sought, or an occurrence of local superelevations can be optimally suppressed. An additional possibility for an optimization is a suppression or attenuation of the generated electrical field in specific regions of the gradient coil.

A method to manufacture a gradient coil correspondingly comprises the Steps: design of a gradient coil according to the method described above; and manufacture of the developed gradient coil.

The resulting gradient coil thus possesses a structure that optimizes an electrical field generated by the gradient coil, for example with regard to a distribution of the field.

By the optimization of the electrical field generated by the gradient coil, the field of application of the gradient coil can be expanded, for example for new applications (such as combined PET-MR systems, for instance) that exhibit a sensitivity to electrical fields. In addition to this, the power profile can also be improved given pure MR applications. For example, formation of voltage peaks in the gradient coil can be avoided via the optimization of the electrical field. Voltage peaks promote the formation of partial discharges between conductors and other conductive structures of the gradient coil. What are known as "spikes" can arise due to partial discharges, which spikes lead to interfering image artifacts (to the point of unusability of the exposures) depending on the measurement sequence that is used.

The parameters of the structure of the gradient coil that are to be varied advantageously have no effect on a magnetic field generated by the gradient coil. The optimization of the magnetic field generated by the gradient coil can thus ensue independent of the optimization of the generated electrical field.

In an exemplary embodiment, the parameters of the structure of the gradient coil that are to be varied include a winding direction of the sub-coils and/or a wiring order of the sub-coils of the gradient coil. These parameters can be varied without significant effort.

The second cited objects are achieved according to the invention by a magnetic resonance apparatus with a gradient coil as described above, and a combined PET-MR system with a gradient coil as described above. The advantages cited above are applicable to the apparatuses as well.

DESCRIPTION OF THE PREFERRED EMBODIMENTS

Figure 1:
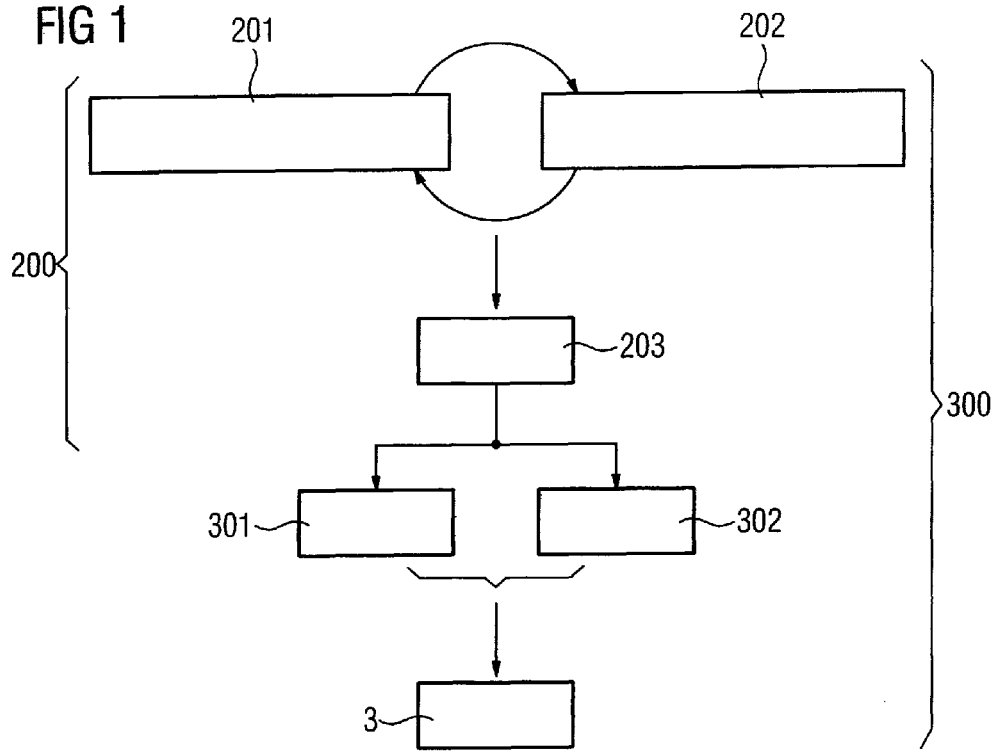
FIG. 1 is a schematic flow chart to illustrate an embodiment of the method according to the invention.

FIG. 1 schematically shows (in a synopsis) a flow chart of the method according to the invention, namely a method 200 to develop a gradient coil 3 and a method 300 to manufacture a gradient coil 3. The gradient coil 3 is composed of sub-coils. The sub-coils are normally wired in series in order to obtain a uniform current in all sub-coils, at least for low frequencies of the gradient currents, and thereby to idealize a magnetic field generated by the gradient coil 3.

In the method 200 to design a gradient coil 3, parameters of the structure of the gradient coil 3 are varied (201) in alternating Steps 201 and 202, and an electrical field generated by a gradient coil 3 with a structure according to a present variation of the parameters is determined (202). A structure with the parameters that optimize the electrical field of the gradient coil 3 is finally selected as a design (Step 203).

The varied parameters of the structure are in particular a winding direction of sub-coils of the gradient coil 3 and/or a wiring order of the sub-coils of the gradient coil 3. For the magnetic field to be generated, the winding direction can be arbitrarily selected. The same applies for the wiring order. In the selection of the two parameters, care is merely to be taken that the flow direction of the current in each sub-coil of the gradient coil runs according to the sought magnetic field. This means that, if the terminal polarity of a sub-coil is inverted, the winding direction must also be inverted. Beyond this, the wiring order and the winding direction are freely variable.

An electrical field generated by the gradient coil 3 can moreover be affected by the parameters of the structure of the gradient coil 3 that are to be varied.

For the method 300 to manufacture a gradient coil 3, a gradient coil 3 is initially designed as described above by means of the method 200. The result of the design 203 of the method 200 to design a gradient coil 3 is then manufactured.

In particular sub-coils of the gradient coil 3 are thereby wound in a predetermined winding direction (Block 301), and/or the sub-coils of the gradient coil are wired according to a predetermined wiring order (Block 302). The winding direction of the sub-coils or the wiring order thereof is selected such that an electrical field generated by the gradient coil 3 is optimized. The predetermined winding direction or the predetermined wiring order was thereby already selected in the method 200 to design a gradient coil 3. The result of the method 300 to manufacture a gradient coil 3 is the gradient coil 3 with an optimized structure, for example with regard to a distribution of an electrical field generated by the gradient coil.

Additional Steps such as a casting of the sub-coils in resin are known and are therefore not described here.

Figure 2:
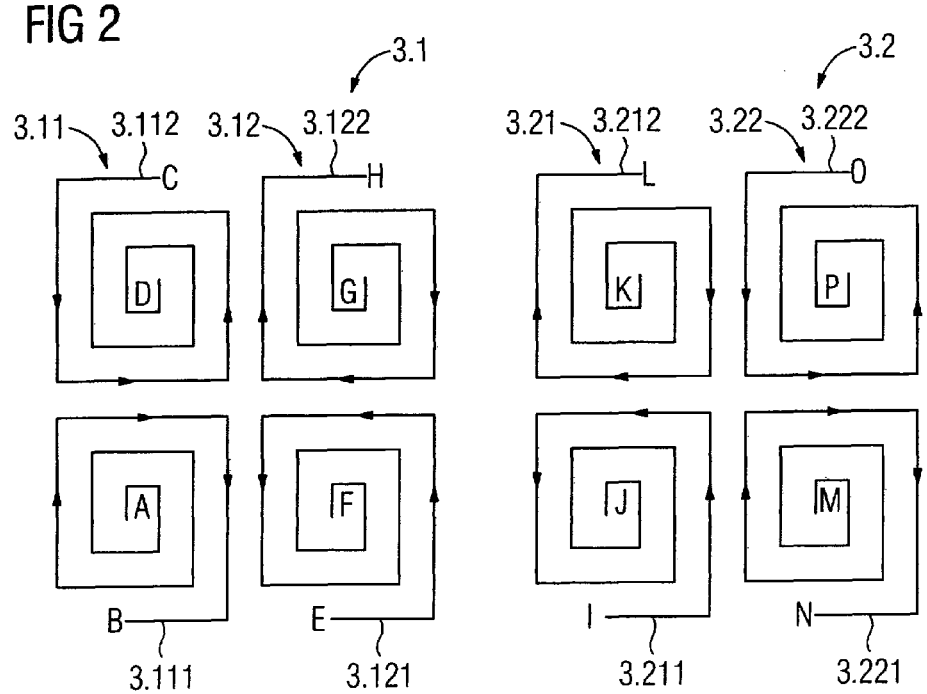
FIG. 2 schematically illustrates a gradient coil according to the invention.

An "expanded" gradient coil 3 is schematically shown in FIG. 2, wherein only the that comprises a primary coil 3.1 and a secondary coil 3.2 for the transversal gradients. The primary coil 3.1 generates the desired magnetic field and the secondary coil 3.2 (also called a shielding coil) shields the magnetic field from the outside.

The primary coil 3.1 comprises two saddle coils 3.11 and 3.12 that respectively are formed by two sub-coils 3.111, 3.112 and 3.121, 3.122 in order to be able to generate the desired magnetic field via a current through the primary coil. The secondary coil 3.2 likewise comprises two saddle coils 3.21 and 3.22 that respectively comprise two sub-coils 3.111, 3.112 and 3.121, 3.122.

It is noted that the sub-coils shown here as rectangles are significantly simplified. The actual geometry of the sub-coils is selected in a known manner such that a generated magnetic field is optimized.

In the representation selected in FIG. 2, the individual sub-coils 3.111, 3.112 and 3.121, 3.122 and 3.111, 3.112 and 3.121, 3.122 are shown next to one another for better illustration. The two saddle coils 3.11 and 3.12 as well as 3.21 and 3.22 are actually respectively curved and combined into a cylindrical primary coil 3.1 or, respectively, secondary coil 3.2.

Figure 3:
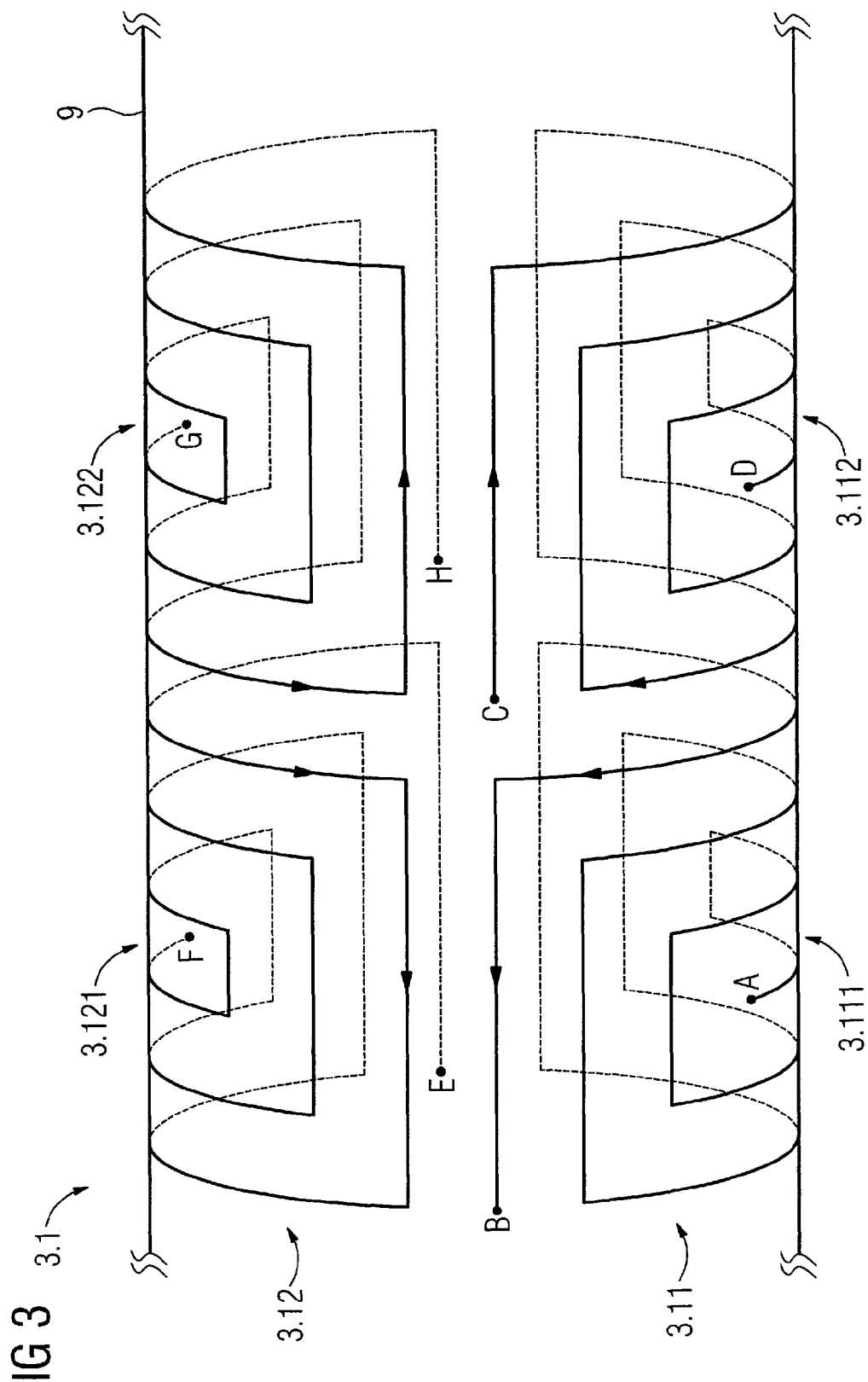
FIG. 3 is a three-dimensional, schematic representation of sub-coils of a gradient coil.

This is shown as an example for the primary coil 3.1 in FIG. 3 in which the saddle coils 3.11 and 3.12 are shown wound on a substrate 9. The secondary coil 3.2 is analogously wound on a carrier with greater diameter than the carrier 9 of the primary coil in order to later possess a circumference that is suitable to arrange the primary coil 3.1 inside the secondary coil 3.2. The secondary coil 3.2 is furthermore spaced by at least a few centimeters from the primary coil 3.1.

The wiring order of the sub-coils indicated in FIG. 2 is: 3.111-3.112-3.121-3.122-3.211-3.212-3.221-3.222. Via this wiring order and the shown winding directions of the sub-coils 3.111 through 3.222, it is achieved in a simple manner that no current directions running in opposite directions exist in adjacent conductors of the gradient coil. This is in particular important with regard to the outer windings of adjacent sub-coils. Via the optimization, large voltage differences between adjacent conductors (and therefore superelevations of the electrical field at these points) are avoided. If two adjacent sub-coils (for example the sub-coils 3.111 and 3.121) are arranged close to one another such that the outer windings of the sub-coils nearly touch, depending on the wiring this can lead to a voltage difference between the two conductors up to the maximum voltage of an amplifier of the gradient coil 3. An extreme superelevation of the electrical field at this location would then result.

The shown gradient coil 3 is thus optimized such that no superelevations of the electrical field occur, in particular in its central region. A current according to the terminal points (designated with "A" through "P") of the sub-coils 3.111 through 3.222 flows through the gradient coil due to the wiring order. The guidance of the connections (not shown) between the terminal points "A" through "P" of the sub-coils 3.111 through 3.222 can thereby be directed arbitrarily since a magnetic field that is generated by such a connection is negligible relative to the field generated by the sub-coils. The connections are therefore normally directed so that an existing space in the gradient coil is utilized as best possible.

By contrast, it can be useful to optimize the direction of the connection lines with regard to an electrical field generated between connection lines and coil 3 or between two connection lines to avoid spikes.

Figure 4:
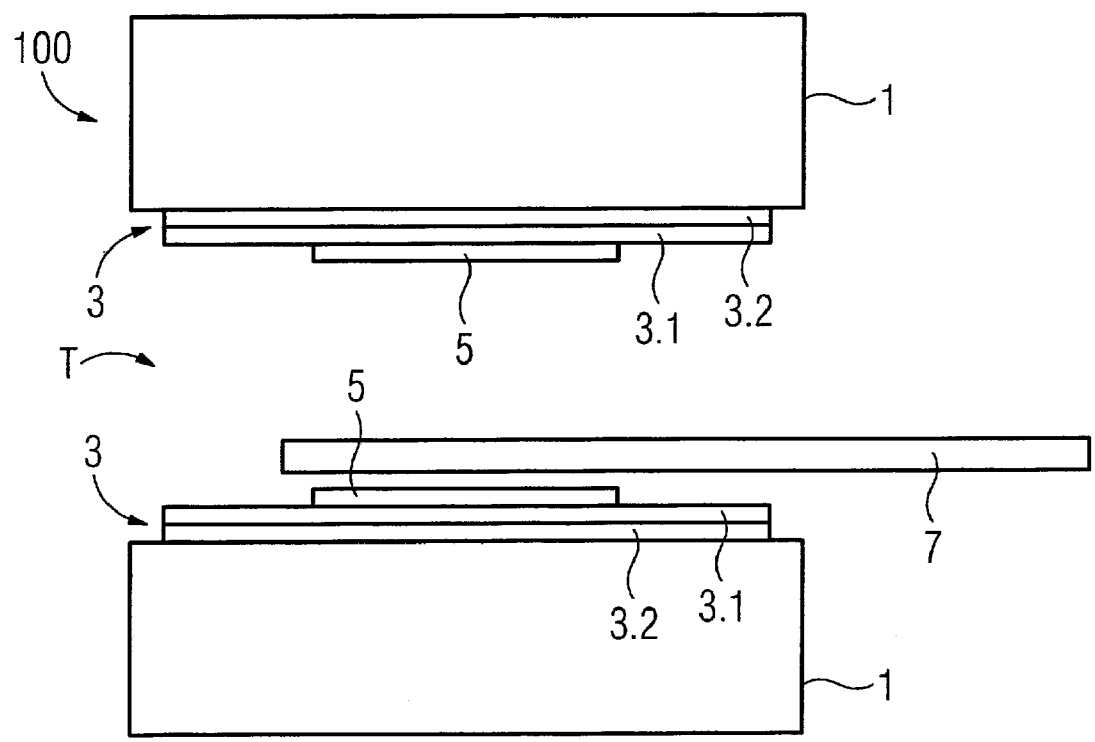
FIG. 4 shows a medical apparatus with a gradient coil according to the invention.

FIG. 4 shows a magnetic resonance apparatus 100 with a gradient coil 3 that comprises a primary coil 3.1 and a secondary coil 3.2 that are surrounded by a magnet unit 1. The gradient coil 3 surrounds a patient tunnel T into which a patient on a patient positioning table 7 can be inserted in order to be subjected to an examination. Additional parts (such as control units and radio-frequency units) of the magnetic resonance apparatus 100 are known and are not shown, for clarity.

The gradient coil 3 is manufactured (for example via the method described above) such that partial discharges between sub-coils 3.111 and 3.222 of the gradient coil 3 are avoided via a suitable distribution of the electrical field generated by the gradient coil 3. As already mentioned above, the formation of "spikes" can thus be avoided.

Furthermore, the magnetic resonance apparatus 100 can be a combined PET-MR system and additionally comprise a PET detection device 5. The PET detection device 5 is thereby likewise arranged in the patient tunnel T in a central region of the gradient coil 3 and is surrounded by the gradient coil 3. The electronics of the PET detection device 5 are thereby sensitive to surrounding electrical fields and can be disrupted by locally superelevated electrical fields. However, an electrical field generated by the gradient coil 3 can be optimized via clever selection of the wiring order and the winding direction of sub-coils 3.111 through 3.222 of the gradient coil 3 such that the electrical field is minimized in the region of the PET detection device 5 of the combined PET-MR system 100 and/or such that no superelevations of the electrical field arise that can disrupt the electronics of the PET detection device 5.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for designing a gradient coil, comprising at least one electrical conductor, said gradient coil having parameters that, in combination, define a structure of said gradient coil, said method comprising:
   configuring said at least one conductor of said gradient coil to produce a gradient magnetic field when said at least one conductor is supplied with current in a magnetic resonance (MR) data acquisition procedure in a combined MR/positron emission tomography (PET) apparatus comprising a PET detector device with PET detector device electronics;
   varying said configuration of said at least one conductor of said gradient coil through a plurality of variations, each variation comprising a different combination of said parameters;
   testing each of said variations to identify an optimal variation, among said plurality of variations, that causes an electrical field generated by the gradient coil to satisfy at least one criterion selected from the group of criteria consisting of said electrical field being minimized in a region in the PET detector device, and said electrical field exhibiting no superelevations that present a risk of interference with said PET detector device electronics; and
   selecting the parameter set of the optimal variation as a final design of said gradient coil.

2. A method as claimed in claim 1 comprising varying said configuration of said at least one conductor by varying parameters, among said parameters that define said structure of said gradient coil, that have no effect on said gradient magnetic field generated by said gradient coil.

3. A method as claimed in claim 1 comprising varying the configuration of said at least one conductor by varying parameters, among said parameters that define the structure of the gradient coil, selected from the group consisting a winding direction of said at least one conductor and a winding order of said at least one conductor.

4. A method as claimed in claim 1 comprising selecting said criterion as said electrical field being minimized in a region in the PET detector device, and comprising identifying said optimal variation as a variation, among said plurality of variations, that causes said electrical field generated by said gradient coil to be minimized in a middle of said gradient coil.

5. A method as claimed in claim 1 comprising configuring said at least one conductor to form a saddle coil.

6. A method as claimed in claim 1 wherein said gradient coil comprises two conductors, and comprising configuring said gradient coil with a first of said two conductors forming a first sub-coil of said gradient coil and a second of said two conductors forming a second sub-coil of said gradient coil.

7. A method as claimed in claim 6 comprising configuring said first sub-coil to generate said gradient magnetic field, and configuring said second sub-coil as a shielding coil that substantially precludes said gradient magnetic field from having an influence outside of said shielding coil.

8. A method as claimed in claim 7 comprising configuring said first sub-coil as a first saddle coil and configuring said second sub-coil as a second saddle coil.

9. A method as claimed in claim 6 comprising varying the configuration of said at least one conductor of said gradient coil by varying, among said parameters that define the structure of said gradient coil, parameters selected from the group consisting of respective winding directions of said first and second sub-coils, and respective wiring orders of said first and second sub-coils.

10. A method for manufacturing a gradient coil, comprising at least one electrical conductor, said gradient coil having parameters that, in combination, define a structure of said gradient coil, said method comprising:
    configuring said at least one conductor of said gradient coil to produce a gradient magnetic field when said at least one conductor is supplied with current in a magnetic resonance (MR) data acquisition procedure in a combined MR/positron emission tomography (PET) apparatus comprising a PET detector device with PET detector device electronics;
    varying said configuration of said at least one conductor of said gradient coil through a plurality of variations, each variation comprising a different combination of said parameters;
    testing each of said variations to identify an optimal variation, among said plurality of variations, that causes an electrical field generated by the gradient coil to satisfy at least one criterion selected from the group of criteria consisting of said electrical field being minimized in a region in the PET detector device, and said electrical field exhibiting no superelevations that present a risk of interference with said PET detector device electronics;
    selecting the parameter set of the optimal variation as a final design of said gradient coil; and
    manufacturing the gradient coil to have said final design.

11. A method as claimed in claim 10 comprising varying said configuration of said at least one conductor by varying parameters, among said parameters that define said structure of said gradient coil, that have no effect on said gradient magnetic field generated by said gradient coil.

12. A method as claimed in claim 10 comprising varying the configuration of said at least one conductor by varying parameters, among said parameters that define the structure of the gradient coil, selected from the group consisting a winding direction of said at least one conductor and a winding order of said at least one conductor.

13. A method as claimed in claim 10 comprising selecting said criterion as said electrical field being minimized in a region in the PET detector device, and comprising identifying said optimal variation as a variation, among said plurality of variations, that causes said electrical field generated by said gradient coil to be minimized in a middle of said gradient coil.

14. A method as claimed in claim 10 comprising configuring said at least one conductor to form a saddle coil.

15. A method as claimed in claim 10 wherein said gradient coil comprises two conductors, and comprising configuring said gradient coil with a first of said two conductors forming a first sub-coil of said gradient coil and a second of said two conductors forming a second sub-coil of said gradient coil.

16. A method as claimed in claim 15 comprising configuring said first sub-coil to generate said gradient magnetic field, and configuring said second sub-coil as a shielding coil that substantially precludes said gradient magnetic field from having an influence outside of said shielding coil.

17. A method as claimed in claim 16 comprising configuring said first sub-coil as a first saddle coil and configuring said second sub-coil as a second saddle coil.

18. A method as claimed in claim 15 comprising varying the configuration of said at least one conductor of said gradient coil by varying, among said parameters that define the structure of said gradient coil, parameters selected from the group consisting of respective winding directions of said first and second sub-coils, and respective wiring orders of said first and second sub-coils.

19. A combined magnetic resonance/positron emission tomography (MR/PET) apparatus comprising:
an MR data acquisition device;
a PET detector device comprising PET detector device electronics;
said MR data acquisition device and said PET detector device being embodied in a common apparatus housing that is shared by said MR data acquisition device and said PET detection device;
said MR data acquisition device comprising a gradient coil comprising at least one conductor, said gradient coil having parameters that, in combination, define a structure of said gradient coil;
said at least one conductor of said gradient coil being configured to produce a gradient magnetic field when supplied with current in an MR data acquisition procedure implemented by said MR data acquisition device; and
said at least one conductor of said gradient coil also being configured to cause an electrical field generated by the gradient coil to satisfy at least one criterion selected from the group consisting of said electrical field being minimized in a region in the PET detector device, and said electrical field exhibiting no superelevations that present a risk of interference with said PET detection device electronics.

20. An apparatus as claimed in claim 19 wherein said at least one conductor has at least one parameter that defines the structure of the gradient coil, selected from the group consisting a winding direction of said at least one conductor and a winding order of said at least one conductor, that configures said gradient coil to satisfy said at least one criterion.

21. An apparatus as claimed in claim 19 wherein said criterion is said electrical field being minimized in a region in the PET detector device, and comprising identifying said optimal variation as a variation, among said plurality of variations, and wherein said at least one conductor is configured to cause said electrical field generated by said gradient coil to be minimized in a middle of said gradient coil.

22. An apparatus as claimed in claim 19 wherein said at least one conductor is configured to form a saddle coil.

23. An apparatus as claimed in claim 19 wherein said gradient coil comprises two conductors, and wherein said gradient coil is configured with a first of said two conductors forming a first sub-coil of said gradient coil and a second of said two conductors forming a second sub-coil of said gradient coil.

24. An apparatus as claimed in claim 23 wherein said first sub-coil is configured to generate said gradient magnetic field, and said second sub-coil is configured as a shielding coil that substantially precludes said gradient magnetic field from having an influence outside of said shielding coil.

25. An apparatus as claimed in claim 24 wherein said first sub-coil is configured as a first saddle coil and said second sub-coil is configured as a second saddle coil.

* * * * *